(12) United States Patent
Bernsen

(10) Patent No.: US 11,112,240 B2
(45) Date of Patent: Sep. 7, 2021

(54) TOOLS, SYSTEMS, AND METHODS FOR LOCATING HIDDEN STUDS AND IDENTIFYING ANGLES ON A FINISHED WALL

(71) Applicant: Collin D. Bernsen, Calabasas, CA (US)

(72) Inventor: Collin D. Bernsen, Calabasas, CA (US)

(73) Assignee: Collin D. Bernsen, Calabasas, CA (US)

( * ) Notice: Subject to any disclaimer, the term of this patent is extended or adjusted under 35 U.S.C. 154(b) by 407 days.

(21) Appl. No.: 15/985,181

(22) Filed: May 21, 2018

(65) Prior Publication Data

US 2019/0353481 A1 Nov. 21, 2019

(51) Int. Cl.
*G01C 9/24* (2006.01)
*G01R 33/00* (2006.01)
*G01V 3/165* (2006.01)

(52) U.S. Cl.
CPC ........... *G01C 9/24* (2013.01); *G01R 33/0076* (2013.01); *G01V 3/165* (2013.01)

(58) Field of Classification Search
CPC ........ H01L 21/00; H01L 2221/00; G01R 1/00
See application file for complete search history.

(56) References Cited

U.S. PATENT DOCUMENTS

| | | | |
|---|---|---|---|
| 2,723,369 A | 11/1955 | Brummett | |
| 5,296,806 A | 3/1994 | Hurl, Jr. | |
| 5,487,222 A * | 1/1996 | Fairchild | G01C 9/28 33/273 |
| 6,456,053 B1 | 9/2002 | Rowley | |
| 6,696,827 B2 | 2/2004 | Fazekas et al. | |
| 6,747,536 B1 | 6/2004 | Miller, Jr. | |
| 7,161,343 B1 | 1/2007 | Biary | |
| 7,690,124 B1 | 4/2010 | Henry | |
| 9,069,028 B2 | 6/2015 | Ebner et al. | |
| 9,329,295 B1 * | 5/2016 | Blake | G01V 3/15 |
| 2003/0067292 A1 | 4/2003 | Fazekas et al. | |
| 2006/0288576 A1 | 12/2006 | Sipe | |
| 2007/0234483 A1 * | 10/2007 | Kunz | G01C 9/28 7/143 |
| 2009/0095075 A1 * | 4/2009 | Vinshtok | G01D 11/245 73/431 |

(Continued)

OTHER PUBLICATIONS

International Search Report for International Application No. PCT/US2019/032923, dated Sep. 23, 2019, 5 pages.

(Continued)

*Primary Examiner* — Jermele M Hollington
*Assistant Examiner* — Temilade S Rhodes-Vivour
(74) *Attorney, Agent, or Firm* — TraskBritt

(57) ABSTRACT

A tool, system, and method are disclosed for locating a hidden stud and identifying angles on a finished wall. The tool includes an elongated housing, at least one magnet, and at least one level. The housing has a generally planar contact surface disposed opposite a viewing surface. The at least one magnet is secured to the housing such that a magnetic field from the at least one magnet extends from the contact surface. The level is secured to the housing such that the level is viewable from the viewing surface. The at least one magnet, the level, and the housing are sized relative to each other such that a magnetic attraction between the at least one magnet and a metallic element in the wall is sufficient to maintain the tool on the wall without external support.

18 Claims, 4 Drawing Sheets

(56) References Cited

U.S. PATENT DOCUMENTS

| | | | |
|---|---|---|---|
| 2010/0205814 A1 | 8/2010 | Allemand | |
| 2011/0138642 A1* | 6/2011 | Norelli | G01C 9/28 |
| | | | 33/371 |
| 2011/0267050 A1* | 11/2011 | Flores | G01R 33/02 |
| | | | 324/259 |
| 2012/0110864 A1 | 5/2012 | Murray et al. | |
| 2012/0174425 A1* | 7/2012 | Clarke | G01V 3/081 |
| | | | 33/528 |
| 2013/0010287 A1* | 1/2013 | Tutton | G01V 3/081 |
| | | | 356/213 |
| 2013/0093417 A1 | 4/2013 | Ebner et al. | |
| 2014/0191750 A1* | 7/2014 | Reime | G01V 3/107 |
| | | | 324/207.16 |

OTHER PUBLICATIONS

International Written Opinion for International Application No. PCT/US2019/032923, dated Sep. 23, 2019, 10 pages.

\* cited by examiner

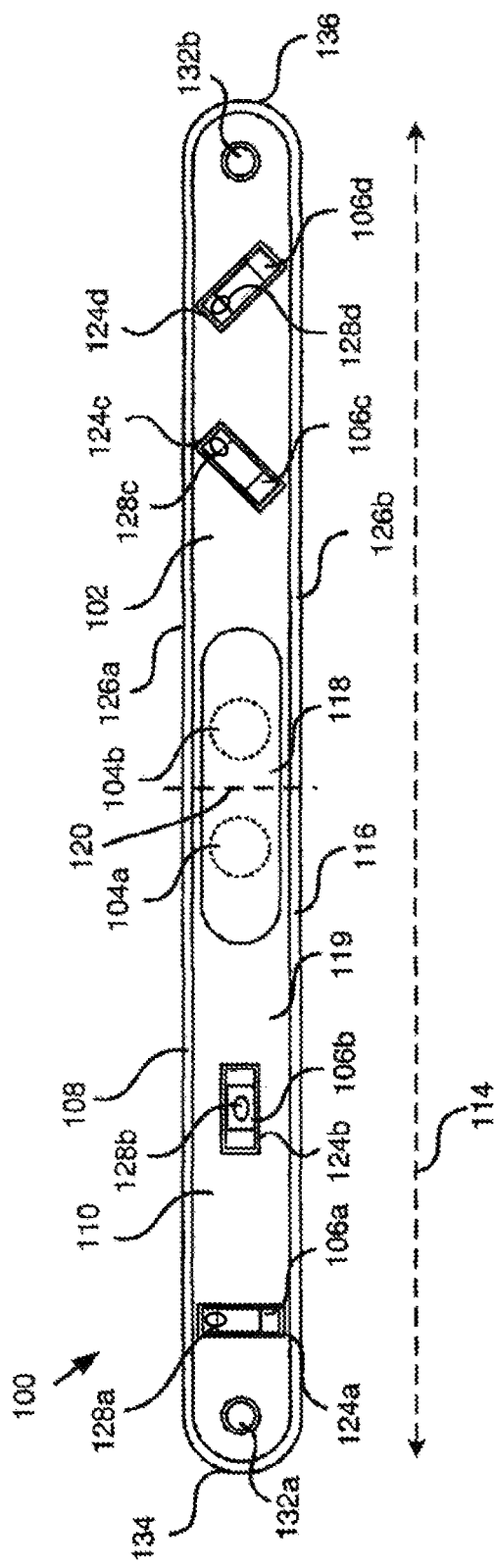
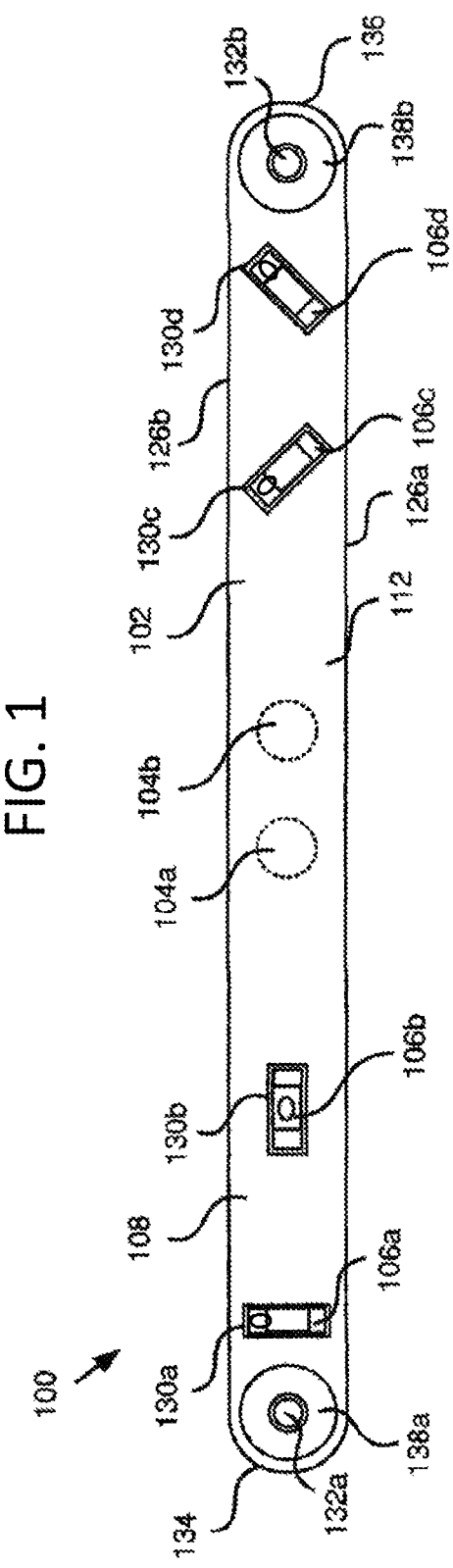
FIG. 1
FIG. 2

TOOLS, SYSTEMS, AND METHODS FOR LOCATING HIDDEN STUDS AND IDENTIFYING ANGLES ON A FINISHED WALL

TECHNICAL FIELD

This invention relates to stud finders and more particularly relates to stud finders adapted to quickly locate adjacent studs and determine angles on finished walls.

BACKGROUND

In constructing buildings, walls are typically framed using a series of vertical studs. Studs may carry vertical structural loads or be non-loadbearing, such as in partition walls, which only separate spaces. Studs hold in place windows, doors, interior finish, exterior sheathing or siding, insulation and utilities and help give shape to a building. In the United States, studs are traditionally made of wood, usually nominally 2"×4" or 2"×6" dimensional lumber and typically placed 16 inches (406 mm) or 24 inches (608 mm) from one another, as measured from center-to-center.

Often the interior finish includes sheets of drywall (also known as plasterboard, wallboard, or gypsum board) positioned adjacent to and covering the studs. The drywall is typically screwed or nailed to the studs using metallic fasteners to create separate usable interior spaces. After the sheets of drywall are secured to the wall studs or ceiling joists, the drywall installer conceals the seams between drywall sheets with joint tape and several layers of joint compound (sometimes called mud). This compound is also applied to any screw holes or defects. The compound is allowed to air dry then typically sanded smooth before painting. Alternatively, for a better finish, the entire wall may be given a skim coat, a thin layer (about 1 mm or 1/16 inch) of finishing compound, to minimize the visual differences between the paper and mudded areas after painting. Ideally, once the drywall has been painted, it is difficult or impossible to visually identify the location of the studs or ceiling joists supporting the drywall.

Once the wall has been finished, an individual may wish to hang art or other items on the finished wall to enhance the aesthetics of the wall or room. To do so, it is oftentimes desirable to view the location of an underlying wall stud or ceiling joist from different, remote perspectives around the room. Furthermore, it may be desirable to determine how the item will look once the item has been leveled.

BRIEF SUMMARY

From the foregoing discussion, it should be apparent that a need exists for a tool, system, and method for locating hidden studs within finished walls. Beneficially, such a tool, system, and method would also provide a visual indication of various angles on the wall. Accordingly, the present subject matter has been developed to provide a tool, system, and method for locating a hidden stud and identifying angles on a finished wall that overcome many or all of the above-discussed shortcomings in the art.

In some embodiments disclosed herein, a tool may assist a user in quickly and easily identifying a location of a stud in a finished wall. Once a first location of a stud has been identified, the tool may assist the user in quickly and easily identifying the location of adjacent studs. Furthermore, the tool may assist the user in identifying angles without the necessity of holding the tool on the wall once the studs have been located.

The tool, in one embodiment, includes an elongated housing, at least one magnet and at least one level. The housing has a generally planar contact surface disposed opposite a viewing surface. The magnet is secured to the housing such that a magnetic field associated with the magnet extends outward from the contact surface. The level is secured to the housing such that the level is viewable from the viewing surface. The magnet, the level, and the housing are sized relative to each other such that a force of a magnetic attraction between the magnet and a metallic element in the wall is sufficient to maintain the tool on the wall without external support.

In certain embodiments, the level is secured to the housing such that when a longitudinal edge of the housing is positioned at a predetermined angle, the level provides a visual indication that the longitudinal edge of the housing is in a selected orientation. The selected orientation, in one embodiment, is an orientation wherein the longitudinal edge of the housing is positioned in a substantially horizontal orientation. In other embodiments, the selected orientation is an orientation wherein the longitudinal edge of the housing is positioned in a substantially vertical orientation. In yet another embodiment, the selected orientation is an orientation wherein the longitudinal edge of the housing is positioned at about a forty-five degree angle or at about a three hundred fifteen degree angle. In such embodiments, the force of the magnetic attraction between the magnet and a metallic element in the wall is sufficient to maintain the longitudinal edge of the housing in the selected orientation without external support. Thus, after withdrawing support to the tool, the tool may remain in place adjacent the wall.

In one embodiment, the tool includes a first level and a second level. The first level is secured to the housing such that, when a longitudinal edge of the housing is positioned in a substantially horizontal orientation, the first level provides a visual indication that the longitudinal edge of the housing is in the substantially horizontal orientation. The second level is secured to the housing such that, when a longitudinal edge of the housing is positioned in a substantially vertical orientation, the second level provides a visual indication that the longitudinal edge of the housing is in the substantially vertical orientation.

In another embodiment, the tool includes a third level that is secured to the housing such that, when a longitudinal edge of the housing is positioned at about a forty-five degree angle, the third level provides a visual indication that the longitudinal edge of the housing is positioned at the forty-five degree angle. In yet another embodiment, the tool includes a fourth level that is secured to the housing such that, when a longitudinal edge of the housing is positioned at about a three hundred fifteen degree angle, the fourth level provides a visual indication that the longitudinal edge of the housing is positioned at the three hundred fifteen degree angle.

The tool, in certain embodiments, includes a first marking orifice and a second marking orifice. The first marking orifice extends through a first end of the housing. The second marking orifice extends through a second end of the housing. The first marking orifice is positioned at a sufficient distance from the second marking orifice such that positioning the first marking orifice over a stud and swinging the housing in the direction of a second stud positions the second marking orifice over the expected location of a second stud. In an exemplary embodiment, the first marking orifice is positioned about sixteen inches from the second marking orifice.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussion of the features and advantages, and similar language, throughout this specification may, but do not necessarily, refer to the same embodiment.

Furthermore, the described features, advantages, and characteristics may be combined in any suitable manner in one or more embodiments. The tool and method may be practiced without one or more of the specific features or advantages of a particular embodiment. In other instances, additional features and advantages may be recognized in certain embodiments that may not be present in all embodiments.

These features and advantages will become more fully apparent from the following description and appended claims.

BRIEF DESCRIPTION OF THE DRAWINGS

A description will be rendered by reference to specific embodiments that are illustrated in the accompanying drawings. Understanding that these drawings depict embodiments of the subject matter and are not therefore to be considered to be limiting in scope, the subject matter will be described and explained with additional specificity and detail through the use of the accompanying drawings, in which:

FIG. 1 is a top view illustrating one embodiment of a tool to locate a hidden stud within a wall;

FIG. 2 is a bottom view further illustrating the tool of FIG. 1;

DETAILED DESCRIPTION

Figure 3:
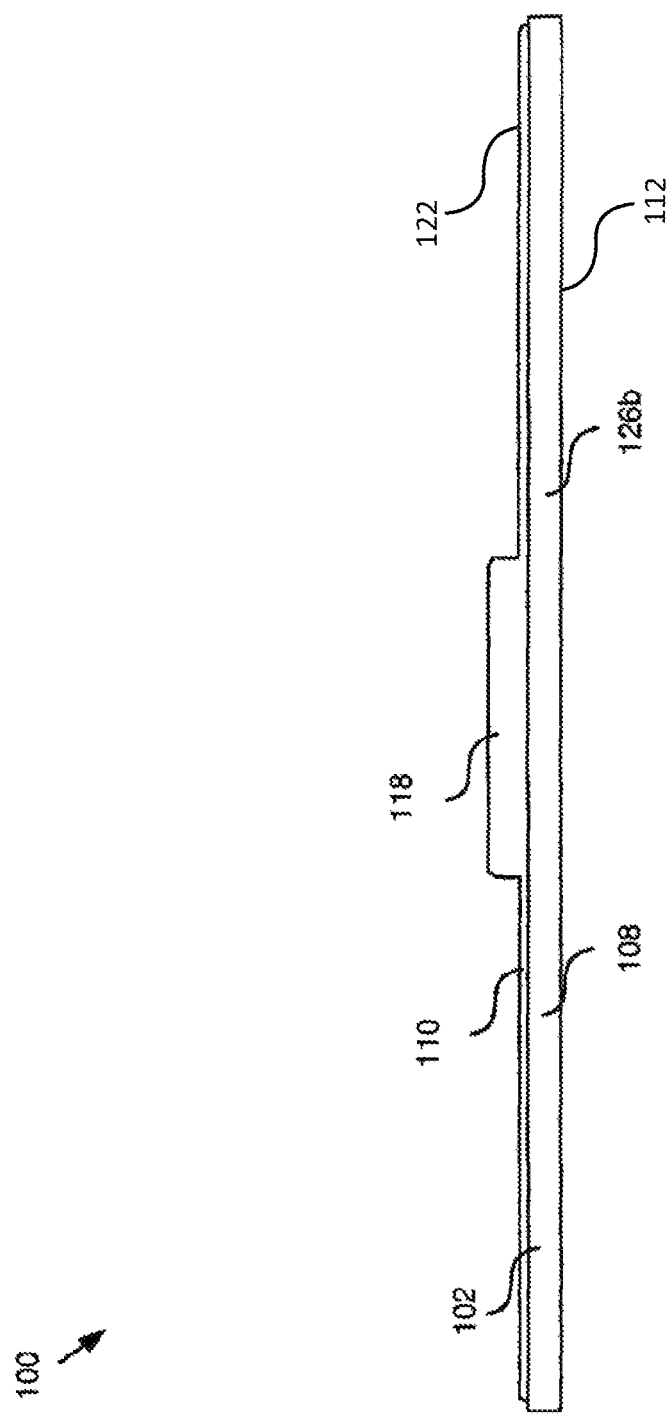
FIG. 3 is a side view further illustrating the tool of FIG. 1.

The following description provides specific details, such as material types, dimensions, and fabrication methods in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional techniques employed in the industry. In addition, the description provided below does not form a complete tool, system, or method for forming or using a tool. Only those process acts and structures necessary to understand the embodiments of the disclosure are described in detail below. Additional acts may be performed by conventional techniques. Also note, the drawings accompanying the present application are for illustrative purposes only, and are thus not drawn to scale. Additionally, elements common between figures may retain the same numerical designation.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features and methods usable in combination therewith should or must be excluded.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "about" used in reference to a given parameter is inclusive of the stated value and has the meaning dictated by the context (e.g., it includes the degree of error associated with measurement of the given parameter).

Reference throughout this specification to "one embodiment," "an embodiment," or similar language means that a particular feature, structure, or characteristic described in connection with the embodiment is included in at least one embodiment disclosed herein. Thus, appearances of the phrases "in one embodiment," "in an embodiment," and similar language throughout this specification may, but do not necessarily, all refer to the same embodiment.

Furthermore, the described features, structures, or characteristics of the disclosure may be combined in any suitable manner in one or more embodiments. In the following description, numerous specific details are provided for a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

FIG. 1 is a top view illustrating one embodiment of a tool 100 to locate a hidden stud within a wall. FIG. 2 is a bottom view, and FIG. 3 is a side view further illustrating the tool 100. The tool 100, in certain embodiments, includes an elongated housing 102, at least one magnet 104a and 104b (collectively magnets 104) and at least one level 106a-106d (collectively levels 106).

The housing 102 may be fabricated from a lightweight, nonmagnetic material, e.g., plastic, wood, aluminum, etc. The housing 102 may include a base member 108 and a cover 110. The base member 108 may be elongated in a lengthwise direction 114. In certain embodiments, a wall 116 circumscribes the base member 108 and extends substantially perpendicularly from the base member 108 to define a component receiving space 119. As is further discussed below, the component receiving space 119 may be sized and shaped to receive various components of the tool 100 such as the magnets 104 and the levels 106.

The cover 110 may be sized and shaped to be received within the component receiving space 119 defined by the wall 116 of the base member 108 such that the cover 110 is matingly received within the base member 108 to form the housing 102. In other embodiments, the cover 110 includes a wall that defines a component receiving space, and the base member 108 is sized and shaped to be received within the receiving space in the cover 110 to form the housing 102. In yet another embodiment, the base member 108 and the cover 110 of the housing 102 may be of similar dimensions such that the edges of the base member 108 and the cover 110 align when placed against one another.

The base member 108 of the housing 102, in certain embodiments, includes a generally planar contact surface 112 (see FIGS. 2 and 3). In one embodiment, one or more magnets 104 are secured to (e.g., positioned within, bonded to, etc.) the housing 102 adjacent the base member 108 such that a magnetic field associated with the magnets 104 extends outward from the contact surface 112 of the base member 108. The magnets 104 are depicted in phantom lines in FIGS. 1 and 2 to indicate that the magnets 104 are within the housing 102, and are not exposed or visible. In other embodiments, the housing 102 may include openings through which the magnets 104 are visible or at least partially extend such that the magnets 104 are viewable through the housing 102.

In use, the contact surface 112 of the housing 102 may be slid over a wall. To avoid marring the wall as a result of sliding the contact surface 112 of the housing 102 over the wall, in certain embodiments the contact surface 112 includes recesses 138a and 138b (collectively recesses 138) for receiving felt pads to protect the wall. As the contact surface 112 of the housing 102 is slid over a wall, the magnetic field associated with the magnets 104 also moves across the wall. When a ferrous object (i.e., a screw, nail or metallic stud) is encountered, the magnets 104 are attracted to the ferrous material. The interaction of the magnets 104 with the ferrous object within the wall indicates the presence of a stud.

In certain embodiments, the tool 100 includes a pair of magnets 104a and 104b positioned equidistant from a center 120 of the housing 102. In one embodiment, the magnets 104a and 104b are positioned between about 0.50 inch (12.7 mm) and 1.00 inch (25.4 mm) apart. In an exemplary embodiment, the magnets 104a and 104b are positioned about 0.75 inch (19.1 mm) apart. In such an embodiment, the magnetic field from each of the magnets 104a and 104b may overlap. The overlapping magnetic fields create a greater likelihood that the magnetic fields will interact with a ferrous object within the wall making the process of finding a stud within the wall easier than would otherwise be the case if the tool 100 includes just a single magnet 104. In other embodiments, the tool 100 may include a single magnet 104 positioned at approximately the center 120 of the housing 102. Similarly, in other embodiments, the tool 100 may include any number of additional magnets 104 to facilitate the locating of ferrous materials within the wall.

The cover 110 may include a viewing surface 122 that is generally viewable when the tool 100 is used to locate a stud. The viewing surface 122 may be disposed opposite the contact surface 112. When the contact surface 112 is positioned adjacent a wall, the viewing surface 122 may be viewable from the top of the housing 102 (i.e., the portion of the housing 102 farthest from the wall). In one embodiment, the cover 110 includes a handle 118 that extends from the viewing surface 122. In such an embodiment, the handle 118 may be used to manipulate the tool 100 to locate ferrous materials within the wall.

In other embodiments, the handle 118 may be omitted, and the tool 100 may be manipulated by grasping the longitudinal edges 126a or 126b (collectively longitudinal edges 126) of the housing 102. In one embodiment, the viewing surface 122 of the cover 110, like the contact surface 112 of the base member 108, may also be generally planar, and the magnets 104 may be positioned adjacent both the contact surface 112 of the base member 108 and the viewing surface 122 of the cover 110 such that the magnetic field associated with the magnets 104 extends outward from both the contact surface 112 of the base member 108 and the viewing surface 122 of the cover 110. In such an embodiment, either the contact surface 112 of the base member 108 or the viewing surface 122 of the cover 110 may be slid or otherwise passed across a wall to magnetically identify a location of studs within the wall.

In one embodiment, the tool 100 includes at least one level 106. In such an embodiment, the cover 110 of the housing 102 includes one or more openings 124a-124d (collectively openings 124) through which the levels 106 can be seen. In other embodiments, the levels 106 may be affixed to a bracket or other mounting point on the cover 110. The levels 106 may include, for example, a generally cylindrical clear vessel containing a liquid and a gas. The gas may form bubbles 128a-128d (collectively bubbles 128) in the levels 106, and the location of the bubbles 128 within the levels 106 may indicate when a particular level 106 is oriented horizontally. The levels 106 are secured to (e.g., positioned within, bonded to, etc.) the housing 102 such that when a longitudinal edge 126a or 126b (collectively longitudinal edges 126) of the housing 102 is positioned at a predetermined angle, the levels 106 provide a visual indication that the longitudinal edges 126 of the housing 102 are in a selected orientation. For example, level 106b may be secured to the housing 102 such that a longitudinal axis of level 106b is substantially parallel to the longitudinal edges 126 of the housing 102. If the selected orientation of the longitudinal edges 126 of the housing 102 is a horizontal orientation, the user adjusts the orientation of the longitudinal edges 126 of the housing 102 until a bubble 128b in the level 106b indicates that the longitudinal edges 126 of the housing 102 are in a substantially horizontal orientation. When the bubble 128b is in the center of level 106b, the longitudinal edges 126 of the housing 102 are oriented in a horizontal orientation.

In certain embodiments, the magnets 104, the levels 106, and the housing 102 are sized relative to each other such that the force of a magnetic attraction between the magnets 104 and a metallic element in the wall is sufficient to maintain the tool 100 on the wall without external support. The force of the magnetic attraction sufficient to maintain the tool 100 on the wall without external support is dependent on the weight of the tool 100. Therefore, in certain embodiments, the components of the 100 are made from lightweight nonmagnetic materials (i.e., plastic, wood, aluminum, lightweight glass, etc.) to keep the tool 100 light. In an exemplary embodiment, the tool 100 weighs less than about 5.0 ounces (142 grams).

In one embodiment, a strength of the magnet(s) 104 is selected such that the force of magnetic attraction between the magnets 104 and a metallic element in the wall is sufficient to maintain the longitudinal edges 126 of the housing 102 in the substantially horizontal orientation without external support. This allows for a hands-free evaluation of the angle of the tool 100 so that a user can step back and look at the tool 100 from another point in the room. A pair of magnets 104 having a residual magnetic flux density (remanence, $B_r$) of at least about 14,800 Gauss (1.48 Tesla) has been found to have a sufficient magnetic attraction to a metallic element in a wall to maintain the longitudinal edges 126 of the housing 102 of an tool 100 weighing 5.0 ounces (142 grams) in the substantially horizontal orientation without external support. Magnets that may be used in the tool 100 are generally described in U.S. Pat. No. 6,696,827, "Magnetic Stud Locator Adapted to Provide Visual Reference Point," issued Feb. 24, 2004, the entire disclosure of which is hereby incorporated by reference.

In other embodiments, a user may wish to position the tool 100 in an orientation wherein the longitudinal edges 126 of the housing 102 are positioned in a substantially vertical orientation. Accordingly, in certain embodiments, a level 106 such as level 106a may be secured to the housing 102 such that a longitudinal axis of level 106a is substantially perpendicular to the longitudinal edges 126 of the housing 102. To position the tool 100 with the longitudinal edges 126 of the housing 102 in a vertical orientation, the user adjusts the orientation of the longitudinal edges 126 of the housing 102 until a bubble 128a in the level 106a indicates that the longitudinal edges 126 of the housing 102 are in a substantially vertical orientation. When the bubble 128a is in the center of level 106a, the longitudinal edges 126 of the housing 102 are oriented in a vertical orientation.

Typically, a magnet 104 having sufficient strength to maintain the longitudinal edges 126 of the housing 102 in the substantially horizontal orientation without external support will also have sufficient strength to maintain the longitudinal edges 126 of the housing 102 in the vertical orientation without external support. However, in certain embodiments, the strength of the magnet(s) 104 may be specifically selected such that the force of magnetic attraction between the magnets 104 and a metallic element in the wall is sufficient to maintain the longitudinal edges 126 of the housing 102 in the vertical orientation without external support. For example, in one embodiment, the tool 100 may include a single level 106 oriented to identify when the longitudinal edges 126 of the housing 102 are positioned in a vertical orientation. In such an embodiment, the tool 100 may be supported by magnets 104 having a magnetic attraction that is less than the magnetic attraction of the magnets 104 used to support four levels 106.

In certain embodiments, the tool 100 may be used to indicate a forty-five degree angle and/or a three hundred fifteen degree angle. For example, in one embodiment, the tool 100 includes a third level 106d and a fourth level 106c. The third level 106d may be secured to the housing 102 such that a longitudinal axis of level 106d is positioned at a three hundred fifteen degree angle with respect to the longitudinal edges 126 of the housing 102. To position the tool 100 with the longitudinal edges 126 of the housing 102 oriented at a forty-five degree angle, the user adjusts the orientation of the longitudinal edges 126 of the housing 102 until a bubble 128d in the level 106d is positioned in the center of the level 106d. When the bubble 128d is in the center of level 106d, the longitudinal edges 126 of the housing 102 are oriented at a forty-five degree angle. Thus, the third level 106d provides a visual indication that the longitudinal edges 126 of the housing 102 are positioned at the forty-five degree angle.

The fourth level 106c may be secured to the housing 102 such that a longitudinal axis of level 106c is positioned at a forty-five degree angle with respect to the longitudinal edges 126 of the housing 102. To position the tool 100 with the longitudinal edges 126 of the housing 102 oriented at a three hundred fifteen degree angle, the user adjusts the orientation of the longitudinal edges 126 of the housing 102 until a bubble 128c in the level 106c is positioned in the center of the level 106c. When the bubble 128c is in the center of level 106c, the longitudinal edges 126 of the housing 102 are oriented at a three hundred fifteen degree angle. Thus, the fourth level 106c provides a visual indication that the longitudinal edge 126 of the housing 102 is positioned at the three hundred fifteen degree angle. The magnets 104 may be selected such that the magnetic force is sufficient to maintain the tool 100 on the wall at a forty-five degree angle or a three hundred fifteen degree angle without external support.

In embodiments wherein the tool 100 includes four levels 106, the tool 100 may be used to identify a horizontal orientation, a vertical orientation, a forty-five degree angle, and a three hundred fifteen degree angle. However, one of skill in the art will recognize that in other embodiments, the tool 100 may include fewer than four levels 106 to determine a horizontal orientation, a vertical orientation, a forty-five degree angle, and a three hundred fifteen degree angle. For example, in certain embodiments, the tool 100 may include only three levels 106. In such an embodiment, the tool 100 may include a first level 106, such as level 106a, that is secured to the housing 102 such that a longitudinal axis of the first level 106a is substantially perpendicular to the longitudinal edges 126 of the housing 102. The first level 106a may be used to determine when the tool 100 is positioned with the longitudinal edges 126 of the housing 102 in a vertical orientation. A second level 106, such as level 106b, may be used to determine when the tool 100 is positioned with the longitudinal edges 126 of the housing 102 in a horizontal orientation. The second level 106b may be secured to the housing 102 such that a longitudinal axis of the second level 106b is substantially parallel to the longitudinal edges 126 of the housing 102.

A third level 106d may be used to determine when the tool 100 is positioned at a forty-five degree angle or a three hundred fifteen degree angle. The third level 106d may be secured to the housing 102 with the longitudinal axis of the third level 106d positioned at either a three hundred fifteen degree angle or a forty-five degree angle with respect to the longitudinal edges 126 of the housing 102 (i.e., in an arrangement similar to either level 106c or level 106d). The third level 106d, either level 106c or 106d, may be used to determine both a forty-five degree angle and a three hundred fifteen degree angle by simply flipping the tool 100 over. In such an embodiment, the handle 118 may be omitted from the cover 110 of the housing 102 so that the cover 110 is substantially planar and the tool 100 can be positioned against the wall without interference from the handle 118. Additionally, in embodiments wherein the tool 100 is configured to be flipped over to determine either the forty-five degree angle or the three hundred fifteen degree angle, the levels 106 are viewable through openings 130a-130d (collectively openings 130) in the base member 108 of the housing 102.

In some embodiments, the tool 100 may include levels 106 oriented at any selected angle, such as 15°, 20°, 30°, 40°, 50°, 60°, 75°, etc. In other embodiments, one or more levels 106 may be rotatable about an axis to enable the user to identify any selected angle.

Knowledge of the location of a first stud can assist in finding adjacent studs. In certain embodiments, the tool 100 includes a first marking orifice 132a and second marking orifice 132b (collectively marking orifices 132). The first marking orifice 132a extends through a first end 134 of the housing 102. The second marking orifice 132b extends through a second end 136 of the housing 102. The first marking orifice 132a extends through the housing 102 at a sufficient distance from the second marking orifice 132b such that positioning the first marking orifice 132a over a stud and swinging the housing 102 in the direction of a second stud positions the second marking orifice 132b over the second stud if the studs are located at standard intervals within the wall. As discussed above, studs and joists are typically placed 16 inches (406 mm) apart, as measured center-to-center. Therefore, the first marking orifice 132a may be positioned approximately 16 inches (406 mm) from the second marking orifice 132b. Each marking orifice 132 may be sized to receive a marking utensil (i.e., a pencil, pen, etc.), a drywall screw, or a nail. In an exemplary embodiment, the orifices 132 have a diameter of about 0.375 inch (9.5 mm).

The overall length of the housing 102, in one embodiment, may be larger than 16 inches (406 mm) to allow sufficient material to surround the first marking orifice 132a and the second marking orifice 132b. In an exemplary embodiment, the overall length of the housing 102 is about 17.5 inches (445 mm). In certain embodiments, the housing 102 includes indicia or markings defining a ruler along one or both of the longitudinal edges 126 of the housing 102.

As discussed above, in certain embodiments, the cover 110 may be sized slightly smaller than the base member 108 such that the cover 110 nests within the base member 108. In other embodiments, the base member 108 may be sized slightly larger than the cover 110 and the base member nests within the cover 110. In yet another embodiment, the base member 108 and the cover 110 are sized such that the side wall 116 of the base member 108 aligns with the outer edge of the cover 110. In the embodiment illustrated in FIG. 3, the base member 108 and the cover 110 are depicted as being separate parts of the housing 102. In some embodiments, the housing 102 may be a unitary body, rather than a distinct base member and cover. The housing 102 (i.e., as a unitary body, or as a combination of a base member 108 and a cover 110) may include an injection molded polymer. If the housing 102 includes a base member 108 and a cover 110, the base member 108 and the cover 110 may be secured to one another by means known in the art, such as by an adhesive, an interference fit, screws, etc.

In one embodiment, the cover 110 includes a handle 118 for manipulating the tool 100. As discussed above, in other embodiments, the handle 118 may be omitted, and a user may grasp the longitudinal edges 126 to manipulate the tool 100.

Figure 4:
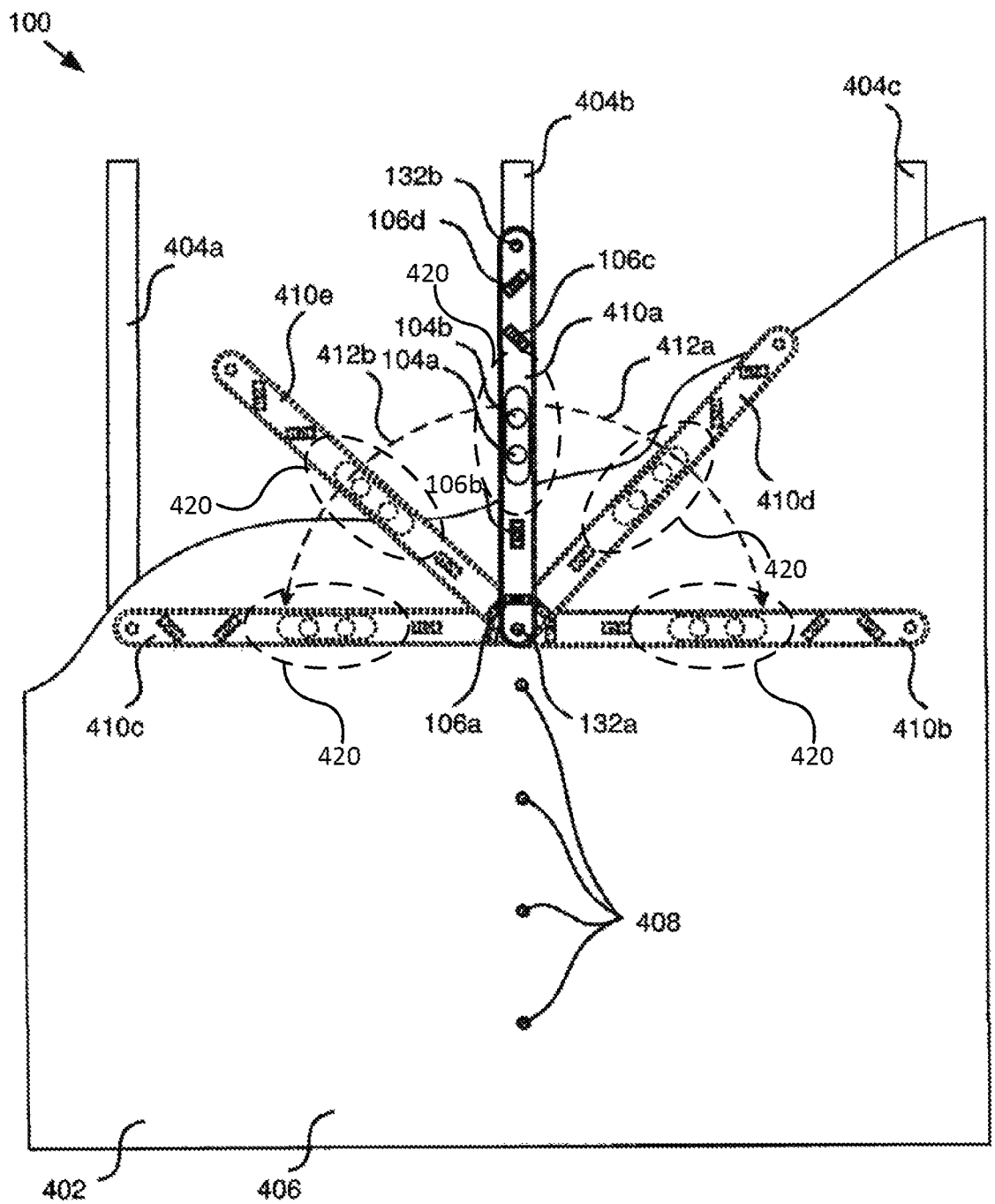
FIG. 4 is a top view of the tool of FIG. 1.

FIG. 4 is a top view of the tool 100 of FIGS. 1-3 with the tool 100 positioned on a wall 402 (i.e., the tool 100 is oriented against a vertical wall 402 and the view of FIG. 4 is perpendicular to the wall 402). In the embodiment illustrated in FIG. 4, the tool 100 is shown in phantom lines in various positions on the wall 402.

In constructing a structure, a wall 402 is typically framed using a series of studs 404a-404c (collectively studs 404). Studs 404 are traditionally made of wood, usually 2"×4" or 2"×6" dimensional lumber and typically placed 16 inches (406 mm) apart, as measured center-to-center. Alternatively, studs 404 may be made of steel, aluminum or other metals. Often the interior finish of the wall 402 includes sheets of drywall 406 positioned over the studs 404. In the embodiment illustrated in FIG. 4, a portion of the drywall 406 is omitted to more clearly depict the locations of the studs 404 behind the drywall 406.

The drywall 406 is typically screwed or nailed to the studs 404 using metallic fasteners 408 to create separate usable spaces (e.g., rooms). After the sheets of drywall 406 are secured to the wall studs 404 or ceiling joists, the installer conceals the seams between sheets of drywall 406 with joint tape and several layers of joint compound. This compound is also applied to any screw holes or defects in the drywall 406, and the wall 402 is then painted. Once the wall 402 has been painted, it is difficult or impossible to visually identify the location of the studs 404 or ceiling joists supporting the drywall 406.

The tool 100 assists in quickly and easily identifying a location of a stud 404 in a finished wall 402, ceiling, or floor. In use, the tool 100 may be positioned on the wall 402 such that the magnets 104 are positioned in a substantially vertical alignment with respect to one another. For example, in certain embodiments, to locate a stud 404, the tool 100 is positioned on the wall 402 vertically in a first arrangement 410a. In one embodiment, in the first arrangement 410a, magnet 104a is vertically aligned below magnet 104b. As discussed above, in an exemplary embodiment, the magnets 104a and 104b are positioned about 0.75 inch (19.1 mm) apart such that the magnetic field from each of the magnets 104a and 104b overlaps, increasing the likelihood that the magnetic field will interact with a metallic fastener 408 within the wall 402. In an exemplary embodiment, the level 106a is used to determine when the tool 100 is oriented in the first arrangement 410a with the magnets 104 vertically aligned.

Vertically aligning the magnets 104 increases the likelihood that a magnetic field 420 associated with one or both of the magnets 104 will interact with one of the metallic fasteners 408. For example, if the tool 100 were rotated from the first arrangement 410a to a second arrangement 410b or a third arrangement 410c, the magnets 104 are aligned substantially horizontally. Because the metallic fasteners 408 are arranged vertically, there may be a greater likelihood that the magnetic field 420 from the magnets 104 will not interact with one of the metallic fasteners 408 when the tool 100 is in the first arrangement 410a or the third arrangement 410c.

Any arrangement of the tool 100 in a position wherein the magnets 104 are not vertically aligned with respect to one another will decrease the likelihood that the magnetic field 420 associated with the magnets 104 will interact with one of the metallic fasteners 408. For example, if the tool 100 were rotated from the first arrangement 410a to a fourth arrangement 410d or a fifth arrangement 410e, a height of the magnetic field 420 associated with the magnets 104 is decreased, which increases the likelihood that the magnetic field 420 will not interact with one of the metallic fasteners 408.

Once a location of a first stud 404 is identified due to the interaction of the magnetic field 420, the tool 100 may be used to quickly and easily identify the location of adjacent studs 404 spaced at a standard distance. As discussed above, in certain embodiments, the first marking orifice 132a extends through the housing 102 at a sufficient distance from the second marking orifice 132b such that positioning the first marking orifice 132a over a stud 404 and swinging the housing 102 in a the direction of a second stud 404 positions the second marking orifice 132b over the expected location of the second stud. For example, in the embodiment illustrated in FIG. 4, once the location of the middle stud 404b has identified, the user positions the first marking orifice 132a over the middle stud 404b and swings the tool 100 about the first marking orifice 132a in a direction indicated by arrow 412a or in the direction indicated by arrow 412b to identify the location of adjacent studs 404a and 404c. Once the tool 100 has been rotated to the second arrangement 410b or the third arrangement 410c, the second marking orifice 132b is positioned over the adjacent studs 404a or 404c. In an exemplary embodiment, the level 106b may be used to determine when the tool 100 is oriented in the second arrangement 410b or the third arrangement 410c.

In one embodiment, the levels 106 may be used to identify angles without the necessity of holding the tool 100 on the wall once the studs 404 have been located. As discussed above, in certain embodiments, the magnets 104, the levels 106, and the housing 102 are sized relative to each other such that the force of magnetic attraction between the magnets 104 and the metallic fasteners 408 (or metallic studs) is sufficient to maintain the tool 100 on the wall 402 without external support. Thus, in certain embodiments, once the tool 100 is positioned such that the magnets 104 are magnetically coupled to the metallic fasteners 408 (or metallic studs), the tool 100 can be rotated three hundred sixty degrees about the center 120 of the housing 102 (FIG. 1).

Level 106a can be used to determine when the tool 100 is positioned in a substantially vertical orientation. Level 106b can be used to determine when the tool 100 is positioned in a substantially horizontal orientation. Level 106d can be used to determine when the tool 100 is positioned in a forty-five degree angle or a two hundred twenty-five degree angle with respect to the vertical orientation. Finally, level 106c can be used to determine when the tool 100 is positioned in a one hundred thirty-five degree angle or a three hundred fifteen degree angle with respect to the vertical orientation.

While the embodiment illustrated in FIGS. 1 and 2 depict the tool 100 as including four levels 106, one of skill in the art will recognize that in other embodiments, the tool 100 may include fewer than four levels 106. For example, in certain embodiments, a user may wish to identify a vertical and a horizontal angle but may be unconcerned with identifying other angles. In such a situation, levels 106c and 106d may be unnecessary.

Figure 5:
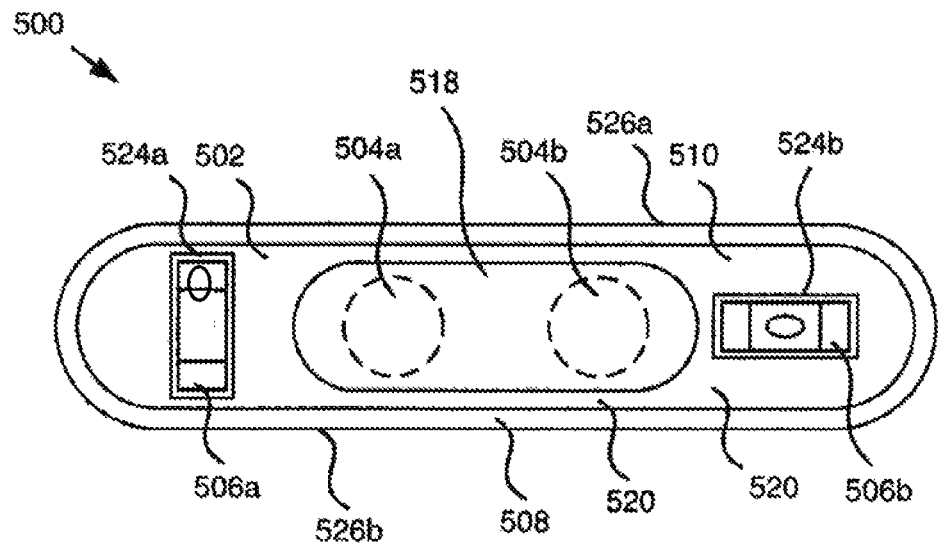
FIG. 5 is a top view illustrating another embodiment of a tool to locate a hidden stud within a wall.
Figure 6:
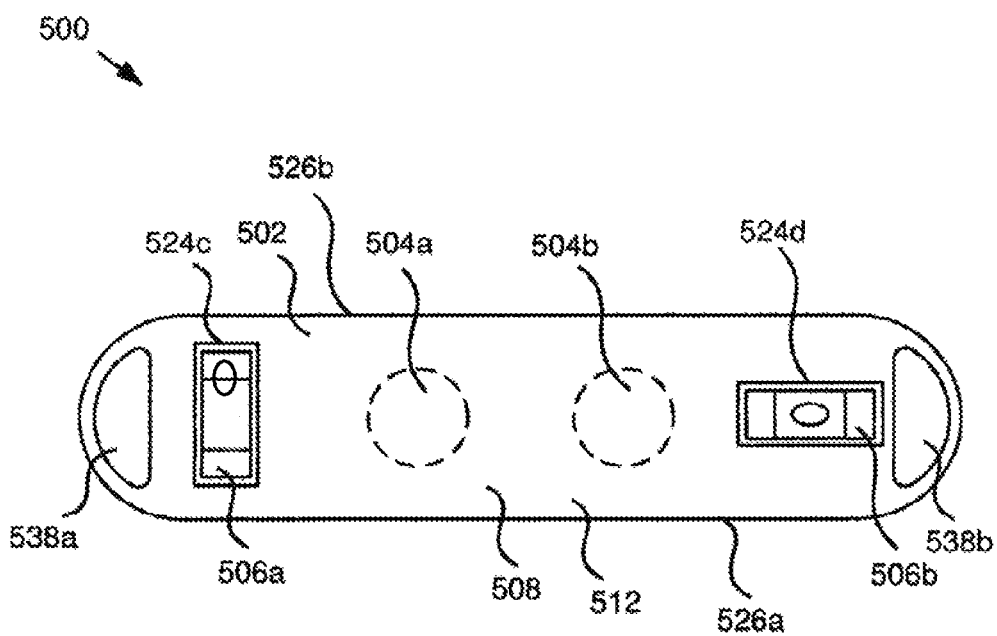
FIG. 6 is a bottom view further illustrating the tool of FIG. 5.

FIG. 5 is a top view illustrating another embodiment of a tool 500 to locate a stud within a wall. FIG. 6 is a bottom view further illustrating the tool 500. The tool 500, in one embodiment, includes a housing 502, at least one magnet 504a and 504b (collectively magnets 504), and at least one level 506a and 506b (collectively levels 506).

The housing 502, in certain embodiments, includes a generally planar contact surface 512 disposed opposite a viewing surface 520. In certain embodiments, the housing 502 is constructed in a manner substantially similar to the way in which the housing 102 of tool 100 (FIGS. 1-3) is described above. Accordingly, the housing 502 may be fabricated from a lightweight material, e.g., plastic, wood, aluminum, etc., and may include a base member 508 and a cover 510. The base member 508 and the cover 510 are sized and shaped to nest with one another in a manner substantially similar to the manner described with respect to the base member 108 and the cover 110 (FIGS. 1-3).

In the embodiment illustrated in FIGS. 5 and 6, because the tool 500 includes fewer levels 506 than the tool 100 (FIGS. 1-3), the housing 502 may be sized substantially shorter than the housing 102 of tool 100. In one embodiment, the housing 502 may have a length of between about 5 inches (127 mm) and about 8 inches (203 mm). In an exemplary embodiment, the housing 502 is approximately 6.5 inches (165 mm) long.

In one embodiment, one or more magnets 504a and 504b (collectively magnets 504) are secured to the housing 502 adjacent the base member 508 such that a magnetic field associated with the magnets 504 extends outward from the contact surface 512 of the base member 508. In the embodiments illustrated in FIGS. 5 and 6, the magnets 504 are depicted in phantom lines to indicate that the magnets 504 are hidden within the housing 502 when the cover 510 is nested with the base member 508. In other embodiments, housing 502 may define openings through which the magnets 504 are visible or at least partially extend such that the magnets 504 are viewable through the housing 502.

In certain embodiments, the cover 510 of the housing 502 includes one or more openings 524a-524d (collectively openings 524) through which the levels 506 can be seen. The levels 506 may be secured to the housing 502 such that when a longitudinal edge 526a or 526b (collectively longitudinal edges 526) of the housing 502 is positioned at a predetermined angle, the levels 506 provide a visual indication that the longitudinal edges 526 of the housing 502 are in a selected orientation. For example, level 506b may be secured to the housing 502 such that a longitudinal axis of level 506b is substantially parallel to the longitudinal edges 526 of the housing 502. If the selected orientation of the longitudinal edges 526 of the housing 502 is a horizontal orientation, the user adjusts the orientation of the longitudinal edges 526 of the housing 502 until level 506b indicates that the longitudinal edges 526 of the housing 502 are in a substantially horizontal orientation. Level 506a may be secured to the housing 502 such that a longitudinal axis of level 506a is substantially perpendicular to the longitudinal edges 526 of the housing 502. If the selected orientation of the longitudinal edges 526 of the housing 502 is a vertical orientation, the user adjusts the orientation of the longitudinal edges 526 of the housing 502 until level 506a indicates that the longitudinal edges 526 of the housing 502 are in a substantially vertical orientation. In certain embodiments, the levels 506 may be affixed to a bracket or other mounting point on the cover 510.

In one embodiment, the cover 510 of the housing 502 includes a handle 518 for manipulating the tool 500. In other embodiments, the handle 518 may be omitted, and the tool 500 may be manipulated by grasping the longitudinal edges 526 of the housing 502. In one embodiment, the viewing surface 522 of the cover 510 is generally planar and the magnets 504 may be positioned adjacent both the contact surface 512 of the base member 508 and the viewing surface 522 of the cover 510 such that the magnetic field associated with the magnets 504 extends outward from both the contact surface 512 of the base member 508 and the viewing surface 522 of the cover 510. In such an embodiment, either the contact surface 512 of the base member 508 or the viewing surface 522 of the cover 510 may be slid across a wall to magnetically identify a location of studs within the wall, as described above.

To avoid marring the wall as a result of sliding the contact surface 512 of the housing 502 over the wall, in certain embodiments the contact surface 512 may include recesses 538a and 538b (collectively recesses 538) for receiving felt pads to protect the wall. In other embodiments, the housing 102 may be made of a non-marring material. In such an embodiment, the recesses 538 and the felt pads may be omitted.

Additional non limiting example embodiments of the disclosure are described below.

Embodiment 1: A tool to locate a hidden stud within a wall. The tool comprises an elongated housing having a generally planar contact surface and a viewing surface, at least one magnet, and at least one level secured to the housing such that the level is viewable from the viewing surface. The at least one magnet is secured to the housing such that a magnetic field associated with the at least one magnet extends outward from the contact surface. The magnetic field associated with the at least one magnet is sufficiently strong to cause a magnetic attraction between the tool and a metallic element in a vertical wall to maintain the tool on the vertical wall without external support.

Embodiment 2: The tool of Embodiment 1, wherein the at least one level is oriented such that when a longitudinal edge of the housing is positioned at a selected orientation, the at least one level provides a visual indication that the longitudinal edge of the housing is oriented at the selected orientation.

Embodiment 3: The tool of Embodiment 2, wherein the selected orientation comprises an orientation wherein the longitudinal edge of the housing is positioned in a substantially horizontal orientation, and wherein the magnetic attraction between the at least one magnet and the metallic element in the wall is sufficient to maintain the longitudinal edge of the housing in the substantially horizontal orientation without external support.

Embodiment 4: The tool of Embodiment 2 or Embodiment 3, wherein the selected orientation comprises an orientation wherein the longitudinal edge of the housing is positioned in a substantially vertical orientation, and wherein the magnetic attraction between the at least one magnet and the metallic element in the wall is sufficient to maintain the longitudinal edge of the housing in the substantially vertical orientation without external support.

Embodiment 5: The tool of any one of Embodiments 2 through 4, wherein the selected orientation comprises an orientation wherein the longitudinal edge of the housing is positioned at about a forty-five degree angle from horizontal, and wherein the magnetic attraction between the at least one magnet and the metallic element in the wall is sufficient to maintain the longitudinal edge of the housing in the forty-five degree angle without external support.

Embodiment 6: The tool of any one of Embodiments 2 through 5, wherein the selected orientation comprises an orientation wherein the longitudinal edge of the housing is positioned at about a three hundred fifteen degree angle from horizontal, and wherein the magnetic attraction between the at least one magnet and the metallic element in the wall is sufficient to maintain the longitudinal edge of the housing in the three hundred fifteen degree angle without external support.

Embodiment 7: The tool of any one of Embodiments 1 through 6, wherein the at least one level comprises a first level and a second level, wherein the first level is oriented such that, when a longitudinal edge of the housing is positioned in a substantially horizontal orientation, the first level provides a visual indication that the longitudinal edge of the housing is in the substantially horizontal orientation and wherein the second level is oriented such that, when a longitudinal edge of the housing is positioned in a substantially vertical orientation, the second level provides a visual indication that the longitudinal edge of the housing is in the substantially vertical orientation.

Embodiment 8: The tool of Embodiment 7, wherein the at least one level further comprises a third level, wherein the third level is oriented such that, when a longitudinal edge of the housing is positioned at about a forty-five degree angle from horizontal, the third level provides a visual indication that the longitudinal edge of the housing is positioned at the forty-five degree angle.

Embodiment 9: The tool of Embodiment 8, wherein the at least one level further comprises a fourth level, wherein the fourth level is oriented such that, when a longitudinal edge of the housing is positioned at about a three hundred fifteen degree angle from horizontal, the fourth level provides a visual indication that the longitudinal edge of the housing is positioned at the three hundred fifteen degree angle.

Embodiment 10: The tool of Embodiment 9, wherein the magnetic attraction between the at least one magnet and a metallic element in the wall is sufficient to maintain the longitudinal edge of the housing in at least one of the horizontal orientation, the vertical orientation, the forty-five degree angle, and the three hundred fifteen degree angle without external support.

Embodiment 11: The tool of any one of Embodiments 1 through 10, further comprising a first marking orifice extending through a first end of the housing and a second marking orifice extending through a second end of the housing, wherein the first marking orifice extends through the housing at a distance from the second marking orifice such that positioning the first marking orifice over a first stud and swinging the housing in a direction of a second stud positions the second marking orifice over an expected location of the second stud.

Embodiment 12: The tool of Embodiment 11, wherein the first marking orifice is positioned about 16 inches (406 mm) from the second marking orifice.

Embodiment 13: The tool of any one of Embodiments 1 through 12, wherein a longitudinal edge of the housing comprises indicia defining a ruler.

Embodiment 14: The tool of any one of Embodiments 1 through 13, wherein the at least one level comprises a generally cylindrical clear vessel containing a liquid and a gas.

Embodiment 15: A method of forming a tool to locate a hidden stud within a wall. The method comprises forming an elongated housing having a generally planar contact surface and a viewing surface; securing at least one level to the housing such that the at least one level is viewable from the viewing surface; and securing at least one magnet to the housing such that a magnetic field associated with the at least one magnet extends outward from the contact surface. The magnetic field associated with the at least one magnet is sufficiently strong to cause a magnetic attraction between the tool and a metallic element in a vertical wall to maintain the tool on the vertical wall without external support.

Embodiment 16: The method of Embodiment 15, wherein forming an elongated housing comprises injection molding at least one portion of the elongated housing.

Embodiment 17: The method of Embodiment 15 or Embodiment 16, wherein forming an elongated housing comprises securing a base member to a cover, wherein the elongated housing comprises the base member and the cover.

Embodiment 18: The method of any of Embodiments 15 through 17, wherein securing at least one level to the housing comprises disposing the at least one level within the housing.

Embodiment 19: A method comprising applying a force to the tool of Embodiment 1 to pass the generally planar contact surface thereof horizontally along a vertical wall. When the magnetic field associated with the at least one magnet causes a magnetic attraction between the tool and a metallic element in the vertical wall, the method includes withdrawing the applied force from the tool, such that the tool remains in place adjacent the vertical wall without an external support.

Embodiment 20: The method of Embodiment 19, further comprising rotating the tool to cause the at least one level to be oriented horizontally.

While the present disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the disclosure as hereinafter claimed, including legal equivalents thereof. In addition, features from one embodiment may be combined with features of another embodiment while still being encompassed within the scope of the disclosure as contemplated. Further, embodiments of the disclosure have utility with different and various materials, tool shapes, etc.

What is claimed is:

1. A tool to locate a hidden stud within a wall, the tool comprising:
   an elongated housing having a generally planar contact surface and a viewing surface;
   at least one magnet secured to the housing such that a magnetic field associated with the at least one magnet extends outward from the contact surface;
   a first level secured to the housing such that the first level is viewable from the viewing surface, the first level configured to provide an indication when the first level is substantially horizontally oriented such that when a longitudinal edge of the housing is in a substantially horizontal orientation, the first level provides a visual indication that the longitudinal edge of the housing is in the substantially horizontal orientation;
   a second level oriented such that when the longitudinal edge of the housing is positioned in a substantially vertical orientation, the second level provides a visual indication that the longitudinal edge of the housing is in the substantially vertical orientation;
   a third level oriented such that, when the longitudinal edge of the housing is positioned at about a forty-five degree angle from the substantially horizontal orientation, the third level provides a visual indication that the longitudinal edge of the housing is positioned at the forty-five degree angle; and
   a fourth level oriented such that, when the longitudinal edge of the housing is positioned at about a three hundred fifteen degree angle from the substantially horizontal orientation, the fourth level provides a visual indication that the longitudinal edge of the housing is positioned at the three hundred fifteen degree angle;
   wherein the magnetic field associated with the at least one magnet is sufficiently strong to cause a magnetic attraction between the tool and a metallic element in a vertical wall to maintain the tool on the vertical wall without external support.

2. The tool of claim 1, wherein the magnetic attraction between the at least one magnet and the metallic element in the wall is sufficient to maintain the longitudinal edge of the housing in the substantially horizontal orientation without external support.

3. The tool of claim 1, wherein the magnetic attraction between the at least one magnet and the metallic element in the wall is sufficient to maintain the longitudinal edge of the housing in the substantially vertical orientation without external support.

4. The tool of claim 1, wherein the magnetic attraction between the at least one magnet and the metallic element in the wall is sufficient to maintain the longitudinal edge of the housing in the forty-five degree angle without external support.

5. The tool of claim 1, wherein the magnetic attraction between the at least one magnet and the metallic element in the wall is sufficient to maintain the longitudinal edge of the housing in the three hundred fifteen degree angle without external support.

6. The tool of claim 1, wherein the magnetic attraction between the at least one magnet and the metallic element in the wall is sufficient to maintain the longitudinal edge of the housing in each of the horizontal orientation, the vertical orientation, the forty-five degree angle, and the three hundred fifteen degree angle without external support.

7. The tool of claim 1, further comprising a first marking orifice extending through a first end of the housing and a second marking orifice extending through a second end of the housing, wherein the first marking orifice extends through the housing at a distance from the second marking orifice such that positioning the first marking orifice over a first stud and swinging the housing in a direction of a second stud positions the second marking orifice over an expected location of the second stud.

8. The tool of claim 7, wherein the first marking orifice is positioned about 16 inches (406 mm) from the second marking orifice.

9. The tool of claim 1, wherein the longitudinal edge of the housing comprises indicia defining a ruler.

10. The tool of claim 1, wherein the at least one level comprises a generally cylindrical clear vessel containing a liquid and a gas.

11. A method comprising:
    applying a force to the tool of claim 1 to pass the generally planar contact surface thereof horizontally along the vertical wall;
    when the magnetic field associated with the at least one magnet causes a magnetic attraction between the tool and the metallic element in the vertical wall, withdrawing the applied force from the tool, such that the tool remains in place adjacent the vertical wall without an external support.

12. The method of claim 11, further comprising rotating the tool to cause the at least one level to be oriented horizontally.

13. The tool of claim 1, further comprising at least another magnet secured to the housing.

14. The tool of claim 13, wherein the at least another magnetic and the magnet are spaced equidistant from a center of the housing.

15. A method of forming a tool to locate a hidden stud within a wall, the method comprising:
    forming an elongated housing having a generally planar contact surface and a viewing surface;
    securing a first level to the housing such that the first level is viewable from the viewing surface, the first level configured to provide an indication when the first level is oriented at a substantially horizontal orientation;
    securing a second level to the housing, the second level configured to provide a visual indication when a longitudinal edge of the housing is in a substantially vertical orientation;
    securing a third level to the housing, the third level configured to provide a visual indication that the longitudinal edge of the housing is positioned at a forty-five degree angle from the substantially horizontal orientation;
    securing a fourth level to the housing, the fourth level configured to provide a visual indication that the longitudinal edge of the housing is positioned at a three hundred fifteen degree angle from the substantially horizontal orientation; and
    securing at least one magnet to the housing such that a magnetic field associated with the at least one magnet extends outward from the contact surface, wherein the magnetic field associated with the at least one magnet is sufficiently strong to cause a magnetic attraction between the tool and a metallic element in a vertical wall to maintain the tool on the vertical wall without external support.

16. The method of claim 15, wherein forming an elongated housing comprises injection molding at least one portion of the elongated housing.

17. The method of claim 15, wherein forming an elongated housing comprises securing a base member to a cover, wherein the elongated housing comprises the base member and the cover.

18. The method of claim 15, wherein securing the first level to the housing comprises disposing the first level within the housing.

\* \* \* \* \*